(12) United States Patent
Jeong

(10) Patent No.: US 9,972,658 B2
(45) Date of Patent: May 15, 2018

(54) ELECTRONIC DEVICE AND METHOD FOR FABRICATING THE SAME

(71) Applicant: SK hynix Inc., Icheon-Si (KR)

(72) Inventor: In-Seok Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 196 days.

(21) Appl. No.: 15/167,612

(22) Filed: May 27, 2016

(65) Prior Publication Data

US 2017/0148847 A1    May 25, 2017

(30) Foreign Application Priority Data

Nov. 24, 2015   (KR) .................. 10-2015-0164653

(51) Int. Cl.

| | |
|---|---|
| *H01L 47/00* | (2006.01) |
| *H01L 27/22* | (2006.01) |
| *H01L 43/02* | (2006.01) |
| *H01L 43/08* | (2006.01) |
| *H01L 45/00* | (2006.01) |
| *H01L 23/528* | (2006.01) |
| *H01L 27/24* | (2006.01) |
| *H01L 43/12* | (2006.01) |
| *G06F 3/06* | (2006.01) |
| *G06F 12/0802* | (2016.01) |

(52) U.S. Cl.
CPC ............ *H01L 27/222* (2013.01); *G06F 3/061* (2013.01); *G06F 3/0656* (2013.01); *G06F 3/0679* (2013.01); *G06F 12/0802* (2013.01); *H01L 23/528* (2013.01); *H01L 27/2463* (2013.01); *H01L 43/02* (2013.01); *H01L 43/08* (2013.01); *H01L 43/12* (2013.01); *H01L 45/06* (2013.01); *H01L 45/08* (2013.01); *H01L 45/1233* (2013.01); *H01L 45/16* (2013.01); *G06F 2212/60* (2013.01)

(58) Field of Classification Search
CPC ......... H01L 21/31144; H01L 21/76816; H01L 23/528; H01L 43/02; H01L 43/08; H01L 43/12; H01L 45/06; H01L 45/08; H01L 45/1233; H01L 45/16; H01L 45/1666; H01L 27/222; H01L 27/2463; G06F 3/061; G06F 3/0656; G06F 3/0679; G06F 12/0802; G06F 2212/60
USPC .............. 438/382; 257/4, 421, 427; 365/148
See application file for complete search history.

(56) References Cited

U.S. PATENT DOCUMENTS

| | | | | |
|---|---|---|---|---|
| 2014/0269005 | A1* | 9/2014 | Kang ................ | H01L 21/31144 365/148 |
| 2015/0052302 | A1* | 2/2015 | Dong ..................... | H01L 43/08 711/118 |

FOREIGN PATENT DOCUMENTS

KR    10-0336371 B1    9/2002

* cited by examiner

*Primary Examiner* — Brook Kebede
(74) *Attorney, Agent, or Firm* — Perkins Coie LLP

(57) ABSTRACT

A semiconductor device may include: a substrate; a first mold layer formed over the substrate and comprising a plurality of bottom conductive patterns connected to the substrate; a second mold layer formed over the first mold layer, and defining a plurality of hole openings, wherein each of the hole openings overlaps each of the bottom conductive patterns; a third mold layer formed over the second mold layer, and defining a plurality of line openings, wherein each of the line openings overlaps two or more hole openings of the hole openings; and a conductive material layer buried in the hole openings and the line openings.

16 Claims, 21 Drawing Sheets

ELECTRONIC DEVICE AND METHOD FOR FABRICATING THE SAME

PRIORITY CLAIMS AND CROSS-REFERENCE TO RELATED APPLICATIONS

The present application claims priority of Korean Patent Application No. 10-2015-0164653, entitled "ELECTRONIC DEVICE AND METHOD FOR FABRICATING THE SAME" and filed on Nov. 24, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory which is capable of facilitating the process and improving the characteristic of a variable resistance element.

In an implementation, a semiconductor device may include: a substrate; a first mold layer formed over the substrate and comprising a plurality of bottom conductive patterns connected to the substrate; a second mold layer formed over the first mold layer, and defining a plurality of hole openings, wherein each of the hole openings overlaps each of the bottom conductive patterns; a third mold layer formed over the second mold layer, and defining a plurality of line openings, wherein each of the line openings overlaps two or more hole openings of the hole openings; and a conductive material layer buried in the hole openings and the line openings.

Implementations of the above semiconductor device may include one or more the following.

The bottom conductive patterns comprise pillar patterns formed through the first mold layer. The bottom conductive patterns comprise a plurality of first and second contact plugs arranged in a mesh type. The first contact plugs are arranged at a predetermined distance from each other in a first direction and a second direction crossing the first direction. The second contact plugs are arranged at a predetermined distance from each other in a first direction and a second direction crossing the first direction. The first contact plugs and the second contact plugs are alternately arranged so as not to overlap each other in a first direction and/or a second direction. The first contact plugs and the second contact plugs are alternately arranged at a predetermined distance from each other in a diagonal direction. The hole openings are arranged in a mesh type. The line openings comprise line-type openings extended in a second direction. The line openings are arranged at a predetermined distance from each other in a first direction. The first to third mold layers comprise an insulating material.

In an implementation, there is provided an electronic device including a semiconductor memory. The semiconductor memory may include: a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings.

Implementations of the above electronic device may include one or more the following.

The electronic device further comprising a plurality of bottom contacts between the semiconductor substrate and the variable resistance elements. The variable resistance elements and the top contacts are arranged at a predetermined distance from each other in a first direction and a second direction crossing the first direction. The source line contacts are arranged at a predetermined distance from each other in a first direction and a second direction crossing the first direction. The top contacts and the source line contacts are alternately arranged so as not to overlap each other in a first direction and/or a second direction. The top contacts and the source line contacts are alternately arranged at a predetermined distance from each other in a diagonal direction. The hole openings are arranged in a mesh type. The line openings comprise line-type openings extended in a second direction. The line openings are arranged at a predetermined distance from each other in a first direction. The line openings comprise openings which overlap the top contacts and openings which overlap the source line contacts. The first and second mold layers comprise an insulating material.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating a semiconductor device may include: forming a first mold layer over a substrate, the first mold layer including a plurality of bottom conductive patterns arranged in a mesh type; forming a second mold layer over the first mold layer; forming a plurality of hole openings overlapping the bottom conductive patterns, respectively, by selectively etching the second mold layer; burying a gap-fill layer in the hole openings; forming a third mold layer over the second mold layer; forming a plurality of line openings, each overlapping two or more hole openings of the hole openings by selectively etching the third mold layer; removing the gap-fill layer; and forming a conductive material layer to fill the hole openings and the line openings at the same time.

Implementations of the above method may include one or more the following.

The bottom conductive patterns comprise pillar patterns formed through the first mold layer. The bottom conductive patterns comprise a plurality of first and second contact plugs arranged in a mesh type. The first contact plugs are arranged at a predetermined distance from each other in a first direction and a second direction crossing the first direction. The second contact plugs are arranged at a predetermined distance from each other in a first direction and a second direction crossing the first direction. The first contact plugs and the second contact plugs are alternately arranged so as not to overlap each other in a first direction and/or a second direction. The first contact plugs and the second contact plugs are alternately arranged at a predetermined distance from each other in a diagonal direction. The hole openings are arranged in a mesh type. The line openings comprise line-type openings extended in a second direction. The line openings are arranged at a predetermined distance from each other in a first direction. The gap-fill layer comprises a material having an etch selectivity with respect to the second and third mold layers. The first to third mold layers comprise an insulating material.

In an implementation, a method for fabricating an electronic device including a semiconductor memory may include: forming a forming a plurality of variable resistance elements over a semiconductor substrate such that the variable resistance elements are arranged in a mesh type; forming a plurality of top contacts over the variable resistance elements; forming a plurality of source line contacts such that the plurality of source line contacts are arranged between the top contacts and connected to the semiconductor substrate; forming a first mold layer defining a plurality of hole openings to overlap the top contacts and the source line contacts, respectively; forming a second mold layer defining a plurality of line openings, each overlapping two or more hole openings of the hole openings; and forming a conductive material layer to fill the hole openings and the line openings at the same time.

Implementations of the above method may include one or more the following.

The method further comprising forming a plurality of bottom contacts over the semiconductor substrate, before the forming of the plurality of variable resistance elements. The variable resistance elements and the top contacts are arranged at a predetermined distance from each other in a first direction and a second direction crossing the first direction. The source line contacts are arranged at a predetermined distance from each other in a first direction and a second direction crossing the first direction. The top contacts and the source line contacts are alternately arranged so as not to overlap each other in a first direction and/or a second direction. The top contacts and the source line contacts are alternately arranged at a predetermined distance from each other in a diagonal direction. The conductive material layer is filled in the hole openings and the line openings at the same time. The line openings comprise line-type openings extended in a second direction. The line openings are arranged at a predetermined distance from each other in a first direction. The line openings comprise openings which overlap the top contacts and openings which overlap the source line contacts. The first and second mold layers comprise an insulating material.

These and other aspects, implementations and associated advantages are described in greater detail in the drawings, the description and the claims.

DETAILED DESCRIPTION

Figure 1A:
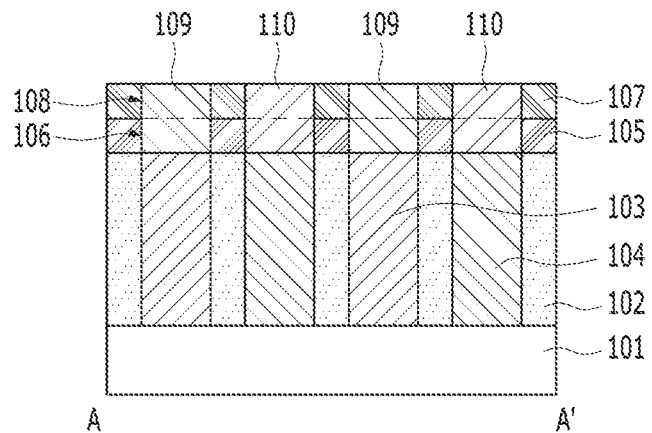
FIGS. 1A and 1B are cross-sectional and plan views of a semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
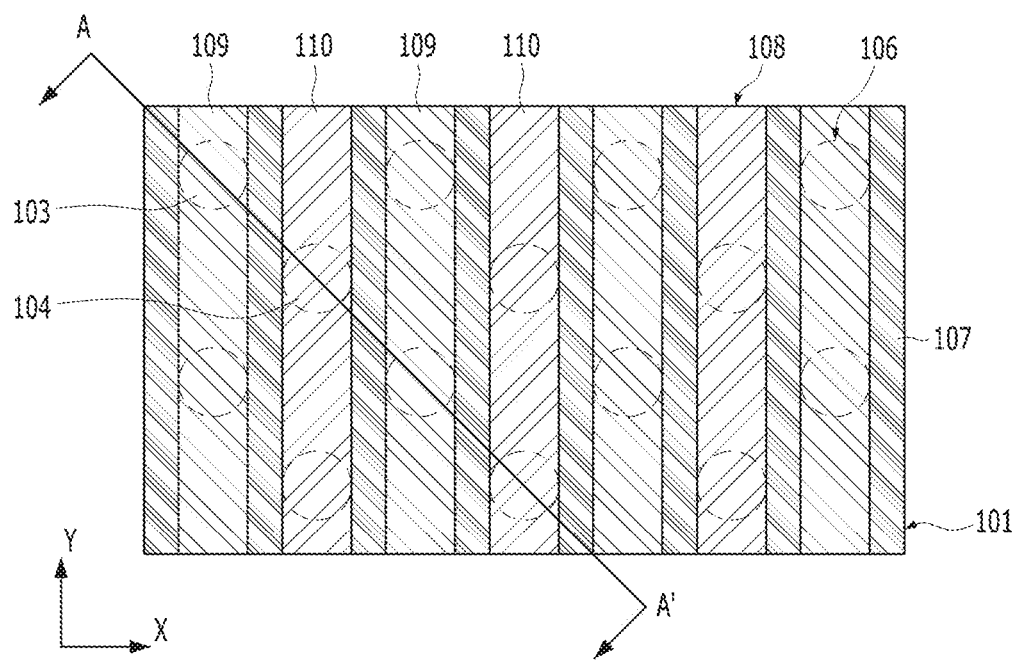

FIGS. 1A and 1B are diagrams for describing a semiconductor device in accordance with an implementation. FIG. 1A is a cross-sectional view of the semiconductor device, and FIG. 1B is a plan view of the semiconductor device. FIG. 1A is a cross-sectional view taken along a line A-A' of FIG. 1B.

As illustrated in FIGS. 1A and 1B, the semiconductor device in accordance with the present implementation may include a first mold layer 102, a second mold layer 105, a third mold layer 107, and a plurality of first and second conductive lines 109 and 110. The first mold layer 102 may be positioned over a semiconductor substrate 101, and include a plurality of first contact plugs 103 and second contact plugs 104 which are alternately arranged. The second mold layer 105 may be positioned over the first mold layer 102, and define a plurality of hole openings 106 at regions overlapping the first and second contact plugs 103 and 104. The third mold layer 107 may be positioned over the second mold layer 105, and define a plurality of line openings 108 at regions overlapping the hole openings 106. As shown in FIG. 1B, each line opening 108 may overlap two or more hole openings 106. The first conductive lines 109 and the second conductive lines 110 may be buried in the hole openings 106 and the line openings 108.

The first mold layer 102 may be formed over the semiconductor substrate 101, and serve as a mold layer for forming the first and second contact plugs 103 and 104. The first mold layer 102 may be formed of an insulating material for insulation between the adjacent contact plugs 103 and 104 and insulation between the semiconductor substrate 101 and the upper layer. The insulating material may include oxide, nitride, or oxynitride.

The first contact plugs 103 and the second contact plugs 104 may have a mesh-type arrangement structure in which the first contact plugs 103 and the second contact plugs 104 are isolated at a predetermined distance from each other in a first direction X and a second direction Y crossing the first direction. At this time, the first contact plugs 103 and the second contact plugs 104 may be alternately arranged so as not to overlap each other in the first direction X and/or the second direction Y, and arranged at a predetermined distance from each other. That is, the first contact plugs 103 and the second contact plugs 104 may be alternately arranged at a predetermined distance from each other in a diagonal direction as indicated by the reference line A-A' of FIG. 1B.

The first contact plugs 103 and the second contact plugs 104 may serve to electrically couple the semiconductor substrate 101 and the upper layer. For this operation, the first and second contact plugs 103 and 104 may be formed of a conductive material. The first contact plugs 103 and the second contact plugs 104 may have the same surface height, but the roles and/or connections thereof may be different from each other.

The second mold layer 105 may define the plurality of hole openings 106 at regions overlapping the first contact plugs 103 and the second contact plugs 104. The second mold layer 105 may serve as a buffer layer for preventing a short between the first and second contact plugs 103 and 104 and the upper layer while securing an overlay margin therebetween. The second mold layer 105 may include an insulating material, for example, oxide, nitride, or oxynitride.

The hole openings 106 may be formed in a mesh type to open the regions overlapping the first and second contact plugs 103 and 104. The hole openings 106 may have the same arrangement as the first and second contact plugs 103 and 104. The line width and positions of the hole openings 106 may be changed, if necessary.

The third mold layer 107 may define the plurality of line openings 108 at regions overlapping the hole openings 106. The third mold layer 107 may serve as a mold layer for forming conductive lines and an insulating layer for insulation between adjacent conductive lines. The third mold layer 107 may include an insulating material, for example, oxide, nitride, or oxynitride.

The line openings 108 may indicate line-type openings extended in the second direction Y, and arranged at a predetermined distance from each other in the first direction X. That is, the line openings 108 may be divided into openings which overlap the first contact plugs 103 and openings which overlap the second contact plugs 104.

The first conductive lines 109 and the second conductive lines 110 may be electrically coupled to the first contact plugs 103 and the second contact plugs 104, respectively. The first and second conductive lines 109 and 110 may include a conductive material to fill the hole openings 106 and the line openings 108 at the same time.

In the present implementation, a distance between the first and second conductive lines 109 and 110 and the first and second contact plugs 103 and 104 can be secured by the thickness of the second mold layer 105 interposed between the first and second conductive lines 109 and 110 and between the first and second contact plugs 103 and 104, which makes possible to prevent a short between the first and second conductive lines 109 and 110 and the first and second contact plugs 103 and 104. That is, although the first and second contact plugs 103 and 104 are formed to a large line width to improve the resistance characteristic, the second mold layer 105 may be interposed thereon so as to secure a distance, which makes it possible to prevent a short to the first and second conductive lines 109 and 110, regardless of the line width of the first and second contact plugs 103 and 104. Furthermore, since the line width and positions of the hole openings 106 formed in the second mold layer 105 can be controlled and the hole openings 106 and the line openings 108 have the damascene shape, the overlay margin between the first and second contact plugs 103 and 104 and the first and second conductive lines 109 and 110 can be maximized.

FIGS. 2A to 2F are cross-sectional views illustrating a method for fabricating a semiconductor device in accordance with an implementation. FIGS. 3A to 3F are plan views illustrating the method for fabricating a semiconductor device in accordance with the implementation. In order to promote understandings, the method will be described with reference to FIGS. 2A to 2F and FIGS. 3A to 3F together. FIGS. 2A to 2F are cross-sectional views taken along A-A line in FIGS. 3A to 3F.

Figure 2A:
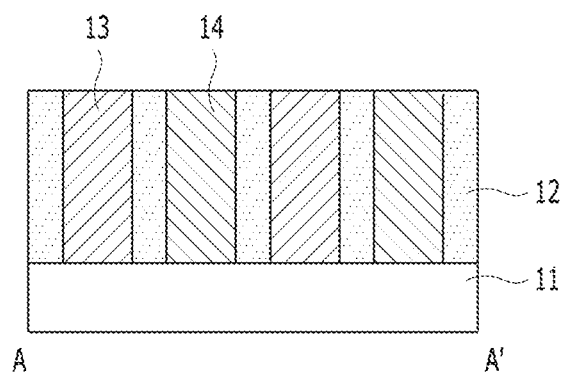
FIGS. 2A to 2F are cross-sectional views illustrating a method for fabricating a semiconductor device in accordance with an implementation.
Figure 3A:
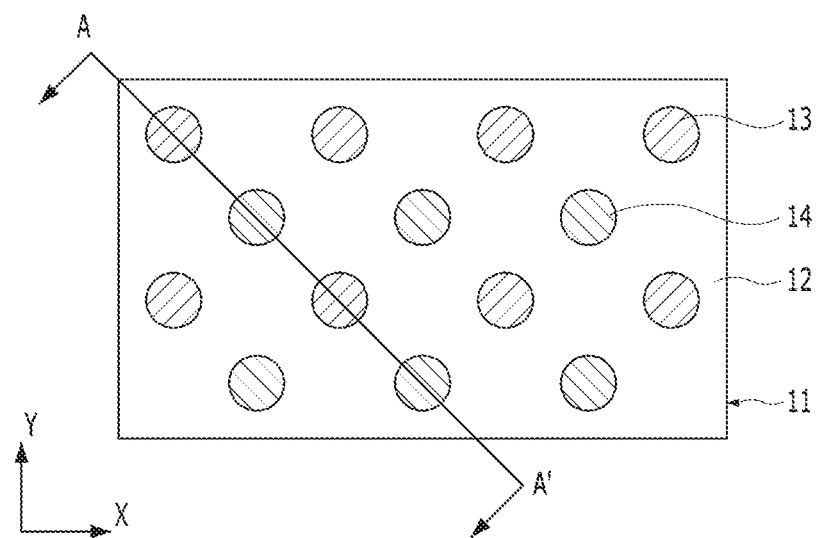
FIGS. 3A to 3F are plan views illustrating the method for fabricating a semiconductor device in accordance with the implementation.

As illustrated in FIGS. 2A and 3A, a first mold layer 12 may be formed over a semiconductor substrate 11. The semiconductor substrate 11 may include a silicon substrate or the like. The first mold layer 12 may serve as an insulating layer for insulation between the first and second contact plugs 13 and 14 and interlayer insulation between the semiconductor substrate 11 and the upper layer (not illustrated). The first mold layer 12 may include an insulating material, for example, oxide, nitride, or oxynitride.

Then, a plurality of first and second contact plugs 13 and 14 may be formed to be electrically coupled to the semiconductor substrate 11 through the first mold layer 12. The first and second contact plugs 14 may be formed through a series of processes of forming a plurality of contact holes which expose the semiconductor substrate 11 through the first mold layer 12, burying a conductive material in the contact holes, and performing an isolation process.

The first and second contact plugs 13 and 14 may be formed at the same time. Alternatively, after the first contact plugs 13 are formed, the second contact plugs 14 may be sequentially formed through an additional contact hole process and burying process. The first contact plugs 13 and the second contact plugs 14 may serve to electrically couple the semiconductor substrate 11 and the upper layer. For this operation, the first and second contact plugs 103 and 104 may be formed of a conductive material. The first and second contact plugs 13 and 14 may be formed to as a large line width as possible, in order to improve the resistance characteristic. The first contact plugs 13 and the second contact plugs 104 may be formed to the same surface height, but the roles and/or connections thereof may be different from each other.

The first contact plugs 13 and the second contact plugs 14 may have a mesh-type arrangement structure in which the first contact plugs 103 and the second contact plugs 104 are isolated at a predetermined distance from each other in a first direction X and a second direction Y crossing the first direction. At this time, the first contact plugs 13 and the second contact plugs 14 may be alternately arranged so as not to overlap each other in the first direction X and/or the second direction Y, and arranged at a predetermined distance from each other. That is, the first contact plugs 13 and the second contact plugs 14 may be alternately arranged at a predetermined distance from each other in the diagonal direction as indicated by the reference line A-A' of FIG. 3A.

Figure 2B:
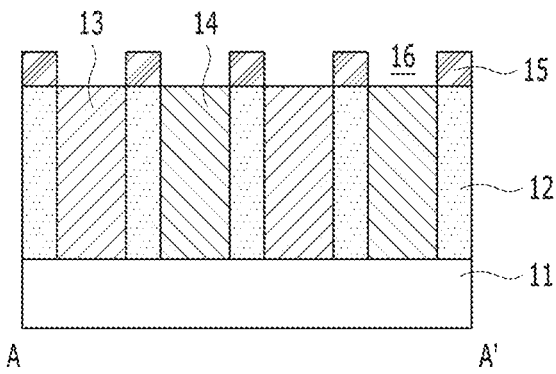
Figure 3B:
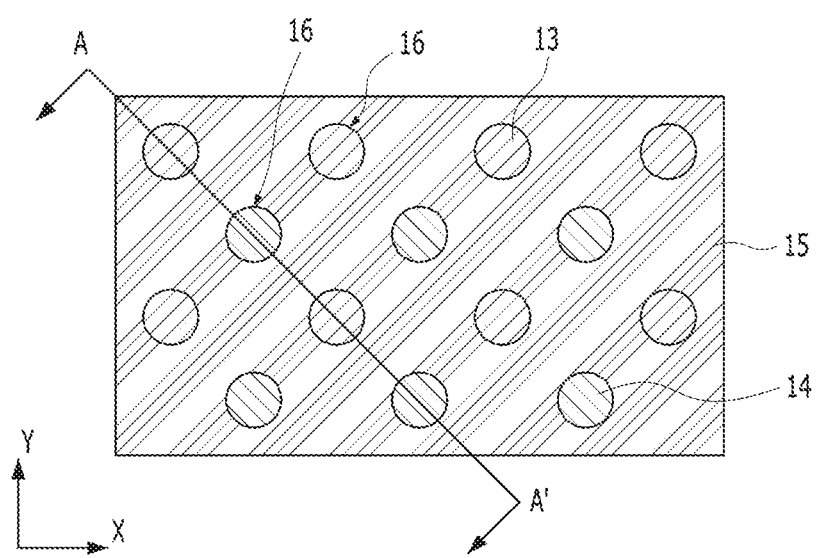

As illustrated in FIGS. 2B and 3B, a second mold layer 15 may be formed on the entire surface of the resultant structure including the first mold layer 12. The second mold layer 15 may serve as a mold layer for defining hole openings 16, and serve as a buffer layer for preventing a short between the first and second contact plugs 13 and 14 and an upper layer (not illustrated) to be formed through a subsequent process while securing an overlay margin therebetween. The second mold layer 15 may include an insulating material, for example, oxide, nitride, or oxynitride.

The second mold layer 15 may be selectively etched to form a plurality of hole openings 16 which expose the first and second contact plugs 13 and 104. The hole openings 16 may be formed in a mesh type to open regions overlapping the first and second contact plugs 13 and 14. The hole openings 16 may have the same arrangement as the first and second contact plugs 13 and 14. The line width and positions of the hole openings 16 may be changed, if necessary.

Figure 2C:
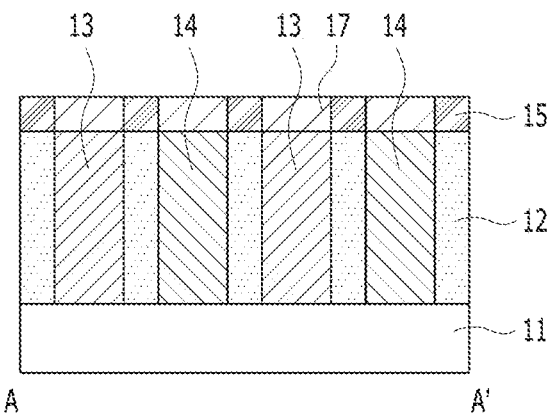
Figure 3C:
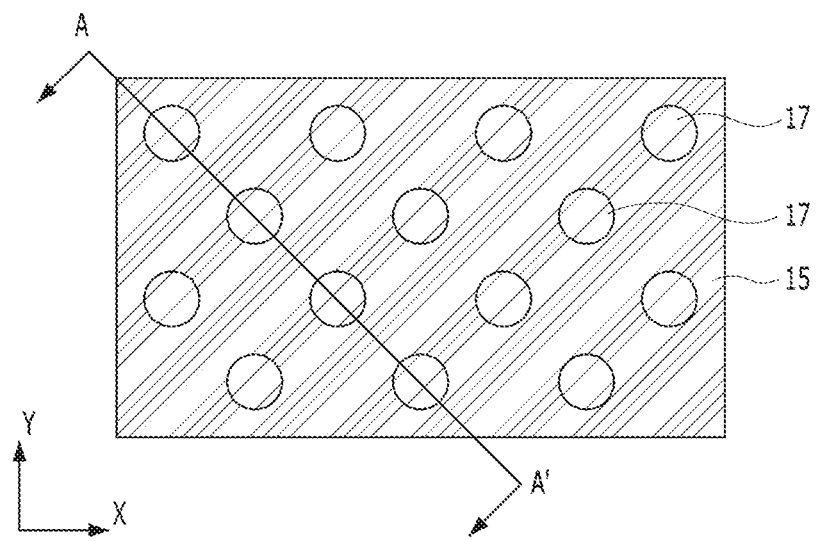

As illustrated in FIG. 2C and 3C, a victim layer 17 may be formed to fill the hole openings 16. The victim layer 17 may serve as a victim layer for forming a damascene structure with line openings (not illustrated) to be formed through a subsequent process. The victim layer 17 may be formed of a material having an etch selectivity with respect to the first and second mold layers 12 and 15. The victim layer 17 may be formed of a material which can be easily removed through wet or dry cleaning. The victim layer 17 may be formed through a series of processes of applying an insulating material to such a sufficient thickness as to fill the hole openings 16, and performing an isolation process for leaving the insulating material in the hole openings 16.

Figure 2D:
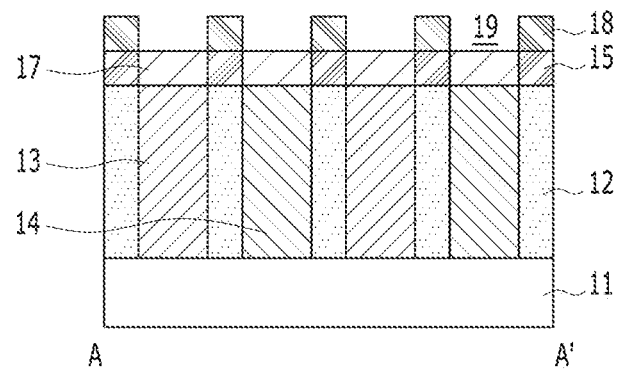
Figure 3D:
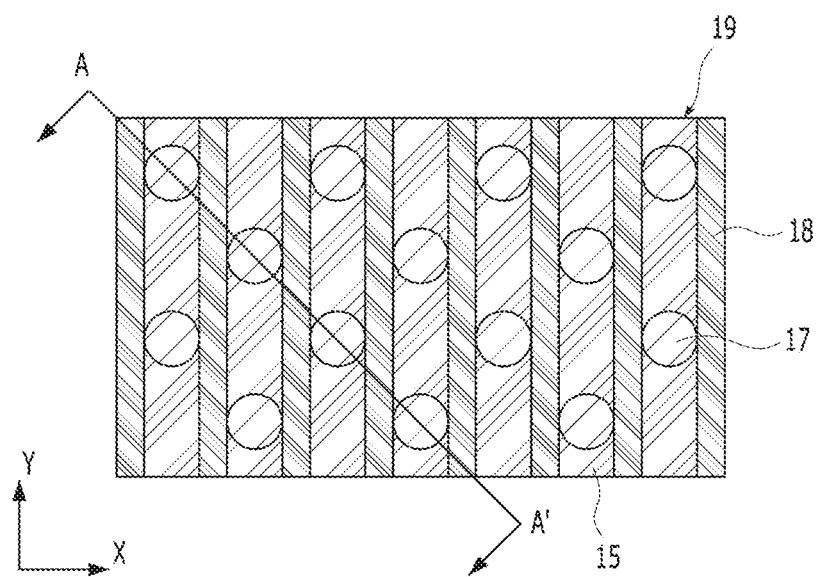

As illustrated in FIGS. 2D and 3D, a third mold layer 18 may be formed on the entire surface of the resultant structure including the second mold layer 15. The third mold layer 18 may serve as a mold layer for forming conductive lines (not illustrated) and an insulating layer for insulation between adjacent conductive lines. The third mold layer 18 may include an insulating material, for example, oxide, nitride, or oxynitride.

The third mold layer 18 may be selectively etched to form a plurality of line openings 19 which expose the victim layer 17. The line openings 19 may indicate line-type openings extended in the second direction Y. The line openings 19 may be arranged at a predetermined distance from each other in the first direction X. That is, the line openings 19 may be divided into openings which overlap the first contact plugs 13 and openings which overlap the second contact plugs 14.

Figure 2E:
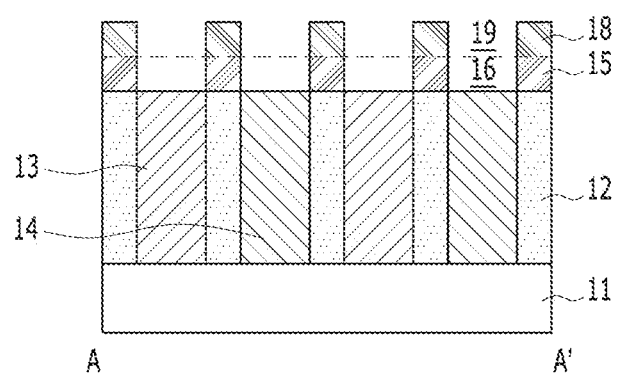
Figure 3E:
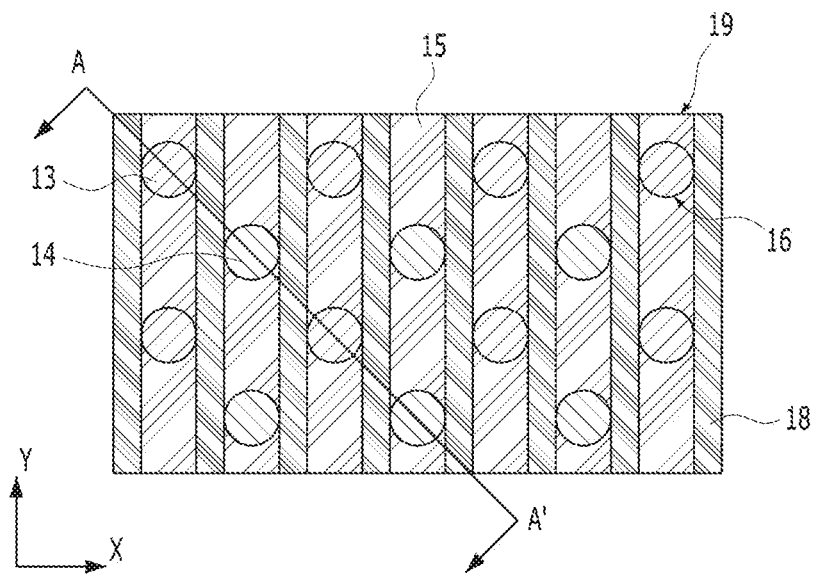

As illustrated in FIGS. 2E and 3E, the victim layer 17 (refer to FIG. 2D) may be removed. The victim layer can be removed through dry or wet cleaning.

As the victim layer is removed, the hole openings 16 may be exposed, and a damascene structure may be formed by the hole openings 16 and the line openings 19.

Figure 2F:
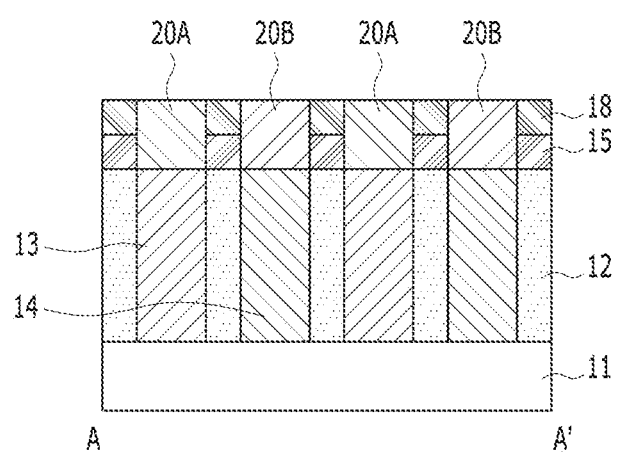
Figure 3F:
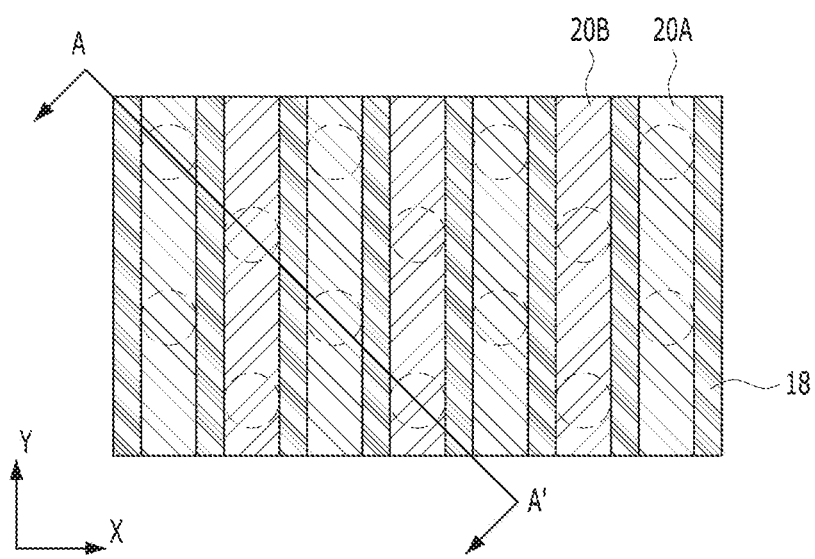

As illustrated in FIG. 2F and 3F, a plurality of first and second conductive lines 20A and 20B may be formed to fill the hole openings 16 and the line openings 19 at the same time. The first and second conductive lines 20A and 20B may be formed through a series of processes of burying a conductive material in the damascene structure formed by the hole openings 16 and the line openings 19, and performing an isolation process for isolating adjacent conductive lines using the third mold layer 18.

The first conductive lines 20A may be electrically coupled to the first contact plugs 13, and the second conductive lines 110 may be electrically coupled to the second contact plugs 104. The first conductive lines 20A and the second conductive lines 20B may be coupled to different power lines according to the roles and connections of the first and second conductive lines 20A and 20B.

In the present implementation, the second mold layer 15 may be interposed between the first and third mold layers 12 and 18, in order to secure a distance between the first and second contact plugs 13 and 14 and the first and second conductive lines 20A and 20B, which makes it possible to prevent a short between the first and second contact plugs 13 and 14 and the first and second conductive lines 20A and 20B. Furthermore, the line width and positions of the hole openings 16 defined by the second mold layer 15 can be controlled, if necessary, and the damascene structure formed by the hole openings 16 and the line openings 19 can maximize an overlay margin between the first and second contact plugs 13 and 14 and the first and second conductive lines 20A and 20B.

Figure 4A:
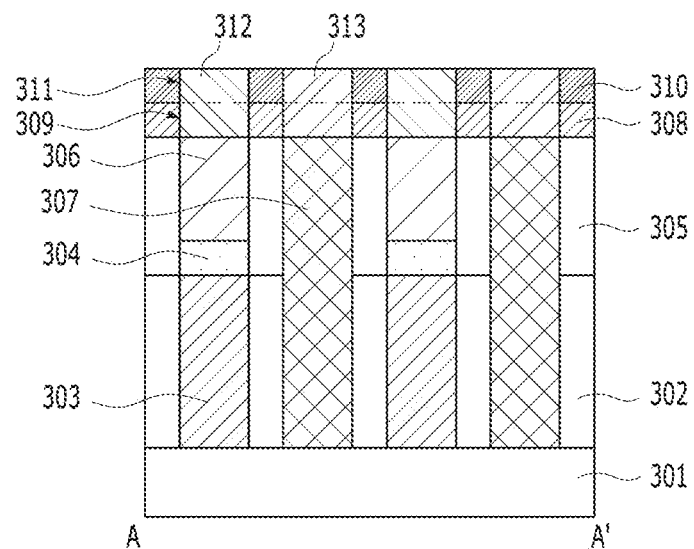
FIGS. 4A and 4B are cross-sectional and plan views of an electronic device in accordance with an implementation.
Figure 4B:
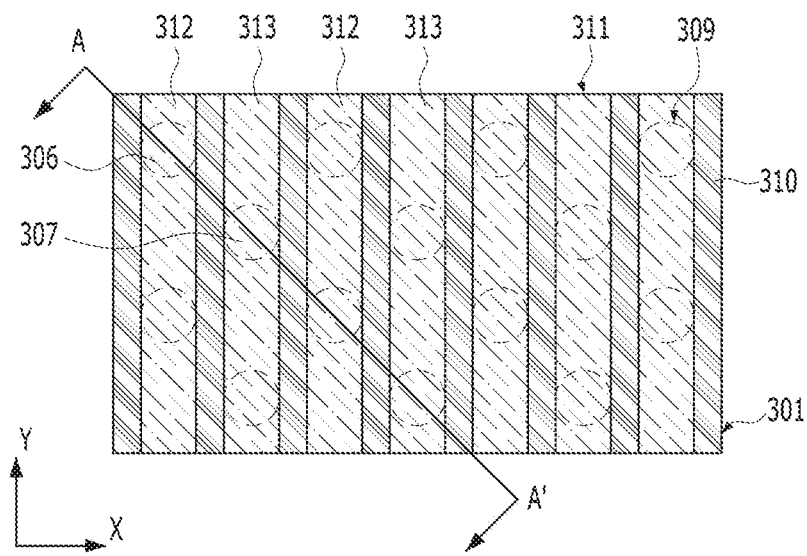

FIGS. 4A and 4B are diagrams for describing an electronic device in accordance with an implementation. FIG. 4A is a cross-sectional view of the electronic device, and FIG. 4B is a plan view of the electronic device. FIG. 4A is a cross-sectional view taken along line A-A' of FIG. 4B.

As illustrated in FIGS. 4A and 4B, the electronic device in accordance with the present implementation may include a semiconductor substrate 301, a plurality of bottom contacts 303, a plurality of variable resistance elements 304, a plurality of top contacts 306, a plurality of source lines 313, a plurality of source line contacts 307, and first and second mold layers 308 and 310. The semiconductor substrate 301 may include required elements (not illustrated) formed therein, for example, transistors for controlling access to the variable resistance elements 304. The bottom contacts 303 may be positioned over the semiconductor substrate 301 so as to connect the bottoms of the variable resistance elements 304 to parts of the semiconductor substrates 301, for example, the drains of the transistors. The variable resistance elements 304 may be positioned over the bottom contacts 303. The top contacts 306 may be positioned over the variable resistance elements 304 so as to connect the tops of the variable resistance elements 304 to bit lines 312. The source lines 313 may be alternately arranged between the bit lines 312. The source line contacts 307 may electrically couple the source lines 313 to parts of the semiconductor substrate 301, for example, the sources of the transistors. The first and second mold layers 308 and 310 may insulate the bit line 312 and the source line 313, which are adjacent to each other.

The semiconductor substrate 301 may include a silicon substrate including transistors (not illustrated) and the like. Over the semiconductor substrate 301, a first interlayer dielectric layer 302 may be formed to insulate the adjacent bottom contacts 303. The first interlayer dielectric layer 302 may include an insulating material, for example, oxide, nitride, or oxynitride.

Over the first interlayer dielectric layer 302, a second interlayer dielectric layer 305 may be formed to insulate the adjacent variable resistance elements 304 and the adjacent top contacts 306. The second interlayer dielectric layer 305 may include an insulating material, for example, oxide, nitride, or oxynitride.

The bottom contact 303 and the top contact 306 may serve as a contact for electrically coupling the semiconductor substrate 301 and the variable resistance element 304 and a contact for electrically coupling the variable resistance element 304 and the bit line 312, respectively. For this operation, the bottom contact 303 and the top contact 306 may be formed of a conductive material.

The bottom contacts 303, the variable resistance elements 304, and the top contacts 306 may form memory elements, and have the same arrangement structure while vertically overlapping one another. The plurality of memory elements including the top contacts 306 may have a mesh-type arrangement structure in which the memory elements are isolated at a predetermined distance from each other in a first direction X and a second direction Y crossing the first direction.

The source line contacts 307 may have a mesh-type arrangement structure in which the source line contacts 307 are isolated at a predetermined distance from each other in the first direction X and the second direction Y crossing the first direction. The source line contacts 307 may be electrically coupled to the semiconductor substrate 301 through the first and second interlayer dielectric layers 302 and 305. For this operation, the source line contacts 307 may be formed of a conductive material.

The memory elements and the source line contacts 307 may have a mesh-type arrangement structure in which the memory elements and the source line contacts 307 are isolated at a predetermined distance from each other in the first direction X and the second direction Y crossing the first direction. At this time, the memory elements and the source line contacts 307 may be alternately arranged so as not to overlap each other in the first direction X and/or the second direction Y, and arranged at a predetermined distance from each other. That is, the memory elements and the source line contacts 307 may be alternately arranged at a predetermined distance from each other in the diagonal direction as indicated by the reference line A-A' of FIG. 3B.

The variable resistance element 304 may be positioned over the bottom contact 303, and include a material which has a characteristic of switching between different resistance states, according to a voltage or current applied across the variable resistance element 304. The variable resistance element 304 can be operated to store data based on the different resistance states. The variable resistance element 304 may include various materials used for RRAM, PRAM, FRAM, MRAM and the like. For example, the various materials may include a transition metal oxide, a metal oxide such as a perovskite-based material, a phase change material such as a chalcogenide-based material, a ferrodielectric material, and a ferromagnetic material. The variable resistance element 304 may have a single-layer structure or a multilayer structure which includes two or more layers to exhibit a variable resistance characteristic.

The first mold layer 308 may be formed over the second interlayer dielectric layer 305, and define a plurality of hole openings 309 at regions overlapping the top contacts 306 and the source line contacts 307. The first mold layer 308 may serve as a buffer layer for preventing a short between the top contact 306 and the source line contact 307 and the bit line 312 and the source line 313 while securing an overlay margin therebetween. The first mold layer 308 may include an insulating material, for example, oxide, nitride, or oxynitride.

The hole openings 309 may include hole patterns arranged in a mesh type to open all of the regions overlapping the top contacts 306 and the source line contacts 307. The line width and positions of the hole openings 309 may be changed, if necessary.

The second mold layer 310 may be positioned over the first mold layer 308, and define a plurality of line openings 311 at regions overlapping the hole openings 309. As shown in FIG. 4B, each line opening 311 may overlap two or more hole openings 309. The second mold layer 310 may serve as a mold layer for forming the bit line 312 and the source line 313 and an insulating layer for insulating the bit line 312 and the source line 313 from each other. The second mold layer 310 may include an insulating material, for example, oxide, nitride, or oxynitride.

The line openings 311 may indicate line-type openings extended in the second direction Y. The line openings 311 may be arranged at a predetermined distance from each other in the first direction X. The line openings 311 may be divided into openings which overlap the top contacts 306 and openings which overlap the source line contacts 307.

The bit lines 312 and the source lines 313 may be electrically coupled to the top contacts 306 and the source line contacts 307, respectively.

In the present implementation, as the first mold layer 308 is interposed between the bit line 312 and the source line 313 and the top contact 306 and the source line contact 307, a distance corresponding to the thickness of the first mold layer 308 can be secured between the bit line 312 and the source line 313 and the top contact 306 and the source line contact 307, which makes possible to prevent a short between the bit line 312 and the source line 313 and the top contact 306 and the source line contact 307. In particular, the line width and positions of the hole openings 309 formed in the first mold layer 308 can be controlled, and the hole openings 309 and the line openings 311 can form the damascene structure, thereby maximizing an overlay margin between the bit line 312 and the source line 313 and the top contact 306 and the source line contact 307.

FIGS. 5A to 5I are cross-sectional views illustrating a method for fabricating an electronic device in accordance with an implementation. FIGS. 6A to 6I are plan views illustrating the method for fabricating an electronic device in accordance with the implementation. In order to promote understandings, the method will be described with reference to FIGS. 5A to 5I and FIGS. 6A to 6I together. FIGS. 5A to 5I are cross-sectional views taken along A-A line in FIGS. 6A to 6I.

Figure 5A:
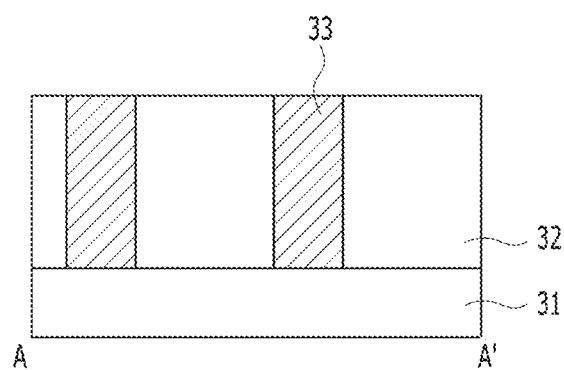
FIGS. 5A to 5I are cross-sectional views illustrating a method for fabricating an electronic device in accordance with an implementation.
Figure 6A:
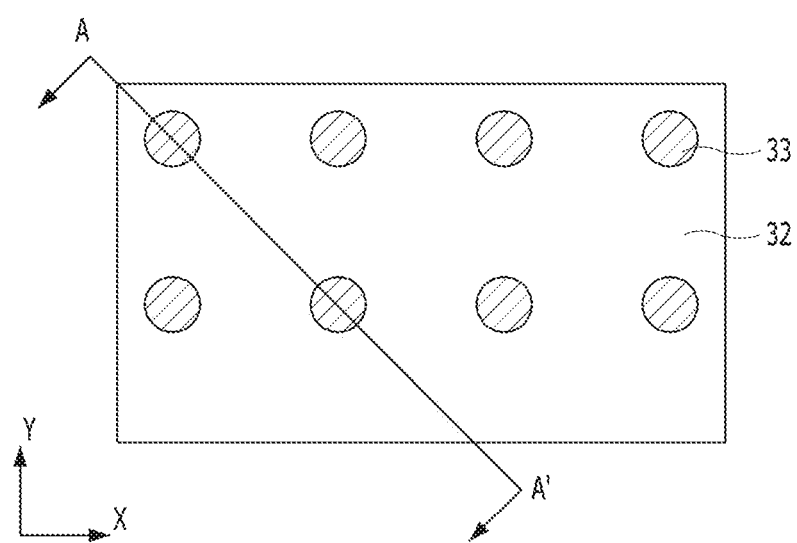
FIGS. 6A to 6I are plan views illustrating the method for fabricating an electronic device in accordance with the implementation.

As illustrated in FIGS. 5A and 6A, a first interlayer dielectric layer 32 may be formed over a semiconductor substrate 31 including required elements (not illustrated), for example, transistors. The first interlayer dielectric layer 32 may serve as an insulating layer for insulation between adjacent bottom contacts 33 and interlayer insulation between the semiconductor substrate 31 and an upper layer (not illustrated). The first interlayer dielectric layer 32 may include an insulating material, for example, oxide, nitride, or oxynitride.

Then, a plurality of bottom contacts 33 may be formed to connect to the substrate 31 through the first interlayer dielectric layer 32. The bottom contacts 33 may be formed through a series of processes of selectively etching the first interlayer dielectric layer 32 to form contact holes which expose parts of the semiconductor substrate 31, for example, drain regions of the transistors, burying a conductive material in the contact holes, and performing an isolation process for isolating adjacent bottom contacts 33 using the first interlayer dielectric layer 32. The bottom contact 33 may serve as a contact for electrically coupling the semiconductor substrate 31 and a variable resistance element to be formed through a subsequent process.

The bottom contacts 33 may have a mesh-type arrangement structure in which the bottom contacts 33 are isolated at a predetermined distance from each other in the first direction X and the second direction Y crossing the first direction.

Figure 5B:
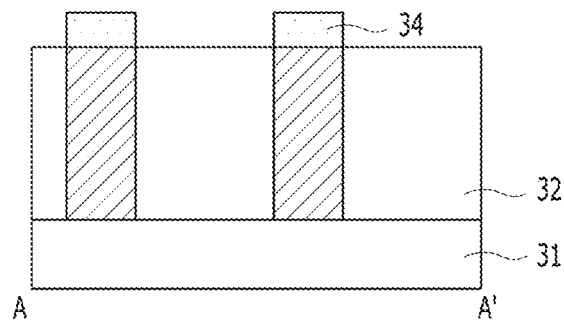
Figure 6B:
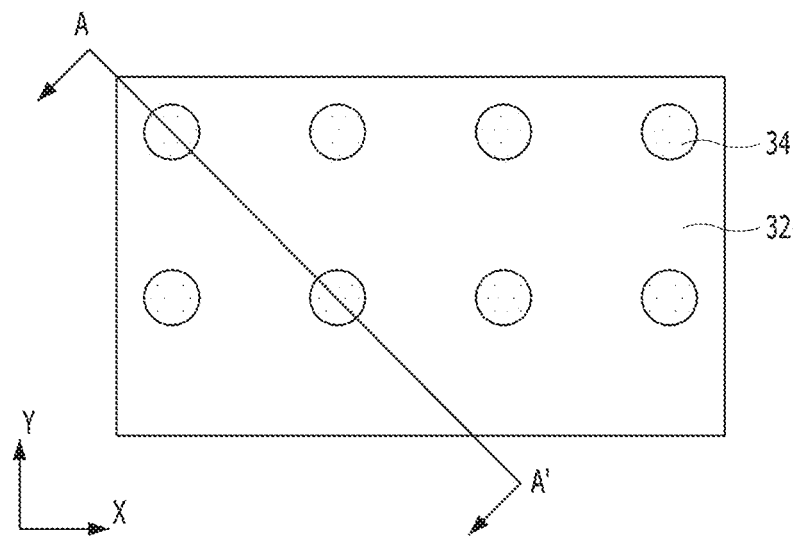

As illustrated in FIGS. 5B and 6B, variable resistance elements 33 may be formed over the bottom contacts 33. The variable resistance elements 34 may be formed through a series of processes of forming a variable resistance layer on the entire surface of the resultant structure including the bottom contacts 33, and patterning the variable resistance layer to be in contact with the bottom contacts 33.

The variable resistance element 34 may include a material which has a characteristic of switching between different resistance states, according to a voltage or current applied across the variable resistance element 34. The variable resistance element 34 may include various materials used for RRAM, PRAM, FRAM, MRAM and the like. For example, the various materials may include a transition metal oxide, a metal oxide such as a perovskite-based material, a phase change material such as a chalcogenide-based material, a ferrodielectric material, and a ferromagnetic material. The variable resistance element 34 may have a single-layer structure or a multilayer structure which includes two or more layers to exhibit a variable resistance characteristic.

Figure 5C:
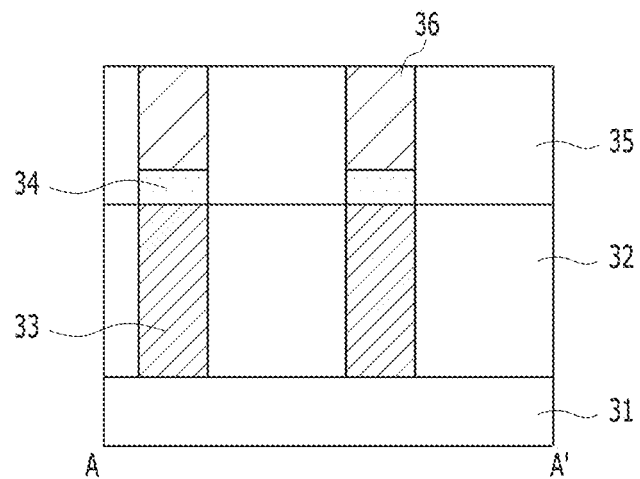
Figure 6C:
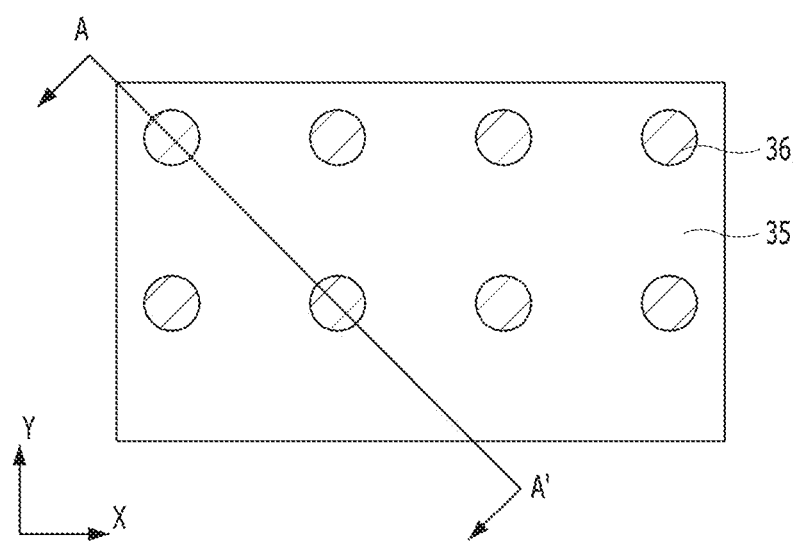

As illustrated in FIGS. 5C and 6C, a second interlayer dielectric layer 35 may be formed over the first interlayer dielectric layer 32. The second interlayer dielectric layer 35 may serve as an insulating layer for insulation between the adjacent variable resistance elements 34 and between the adjacent top contacts 36. The second interlayer dielectric layer 35 may include an insulating material, for example, oxide, nitride, or oxynitride.

Then, a plurality of top contacts 36 may be formed to be in contact with the variable resistance elements 34 through the second interlayer dielectric layer 35. The top contacts 36 may be formed through a series of processes of selectively etching the second interlayer dielectric layer 35 to form contact holes which expose the variable resistance elements 34, burying a conductive material in the contact holes, and performing an isolation process for isolating the adjacent top contacts 36 using the second interlayer dielectric layer 35.

The bottom contacts 33, the variable resistance elements 34, and the top contacts 36 may form memory elements, and have the same arrangement structure while vertically overlapping one another. That is, the plurality of memory elements including the top contacts 36 may have a mesh-type arrangement structure in which the memory elements are isolated at a predetermined distance from each other in the first direction X and the second direction Y crossing the first direction.

Figure 5D:
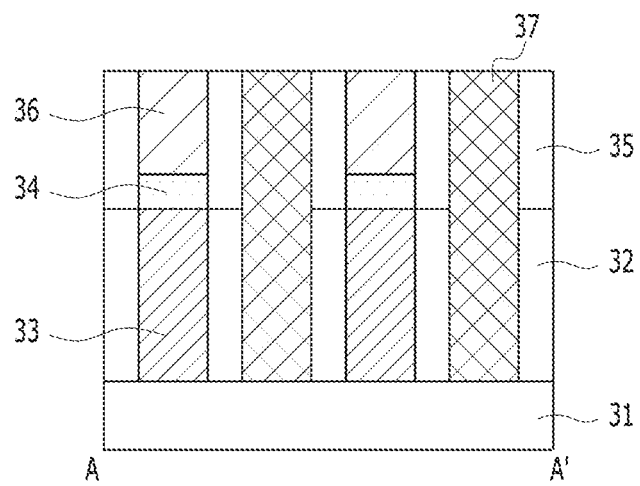
Figure 6D:
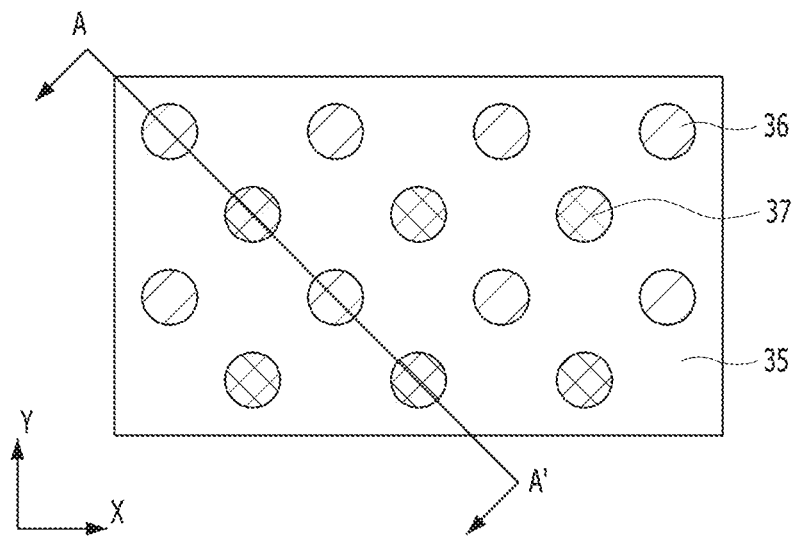

As illustrated in FIGS. 5D and 6D, a plurality of source line contacts 37 may be formed to be electrically coupled to the semiconductor substrate 31 through the first and second interlayer dielectric layers 32 and 35 between the top contacts 36. The source line contacts 37 may have a mesh-type arrangement structure in which the source line contacts 37 are isolated at a predetermined distance from each other in the first direction X and the second direction Y crossing the first direction.

At this time, the top contacts 36 and the source line contacts 37 may be alternately arranged so as not to overlap each other in the first direction X and/or the second direction Y, and arranged at a predetermined distance from each other. That is, the top contacts 36 and the source line contacts 37 may be alternately arranged at a predetermined distance from each other in a diagonal direction as indicated by the reference line A-A' of FIG. 6D.

Figure 5E:
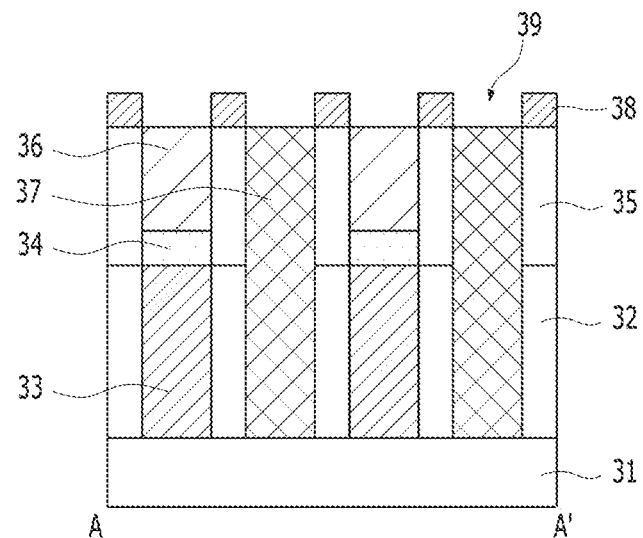
Figure 6E:
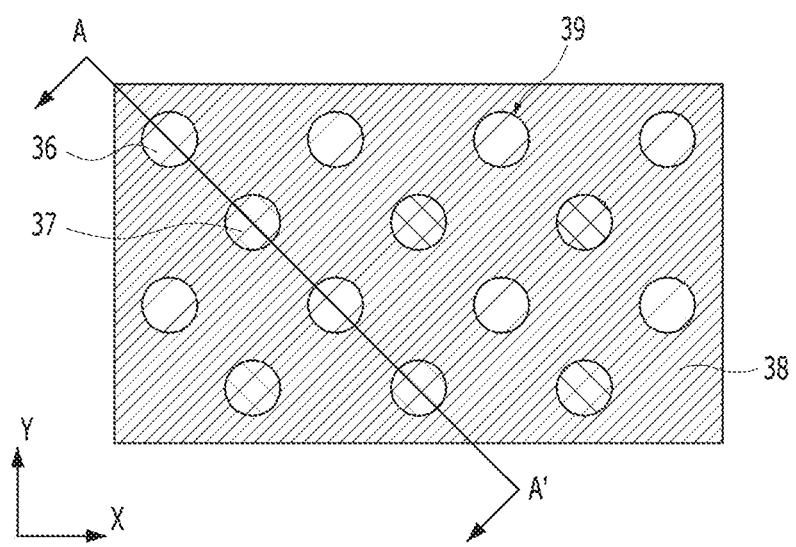

As illustrated in FIGS. 5E and 6E, a first mold layer 38 may be formed on the entire surface of the resultant structure including the second interlayer dielectric layer 35. The first mold layer 38 may serve as a mold layer for defining a plurality of hole openings 39, and serve as a buffer layer for preventing a short between the top contacts 36 and the source line contacts 37 and conductive lines (not illustrated) to be formed through a subsequent process while securing an overlay margin therebetween. The first mold layer 38 may include an insulating material, for example, oxide, nitride, or oxynitride.

The first mold layer 38 may be selectively etched to form a plurality of hole openings 39 which expose the top contacts 36 and the source line contacts 37. The hole openings 39 may be formed in a mesh type to open all of the regions overlapping the top contacts 36 and the source line contacts 37. The hole openings 39 may have the same arrangement as the top contacts 36 and the source line contacts 37. The line width and positions of the hole openings 39 may be changed, if necessary.

Figure 5F:
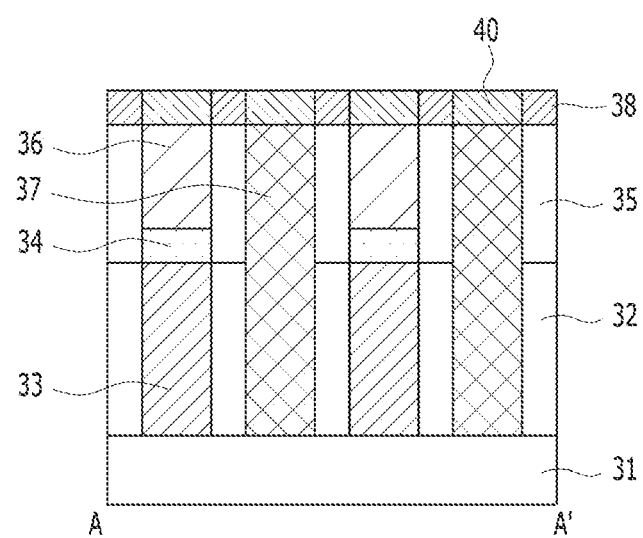
Figure 6F:
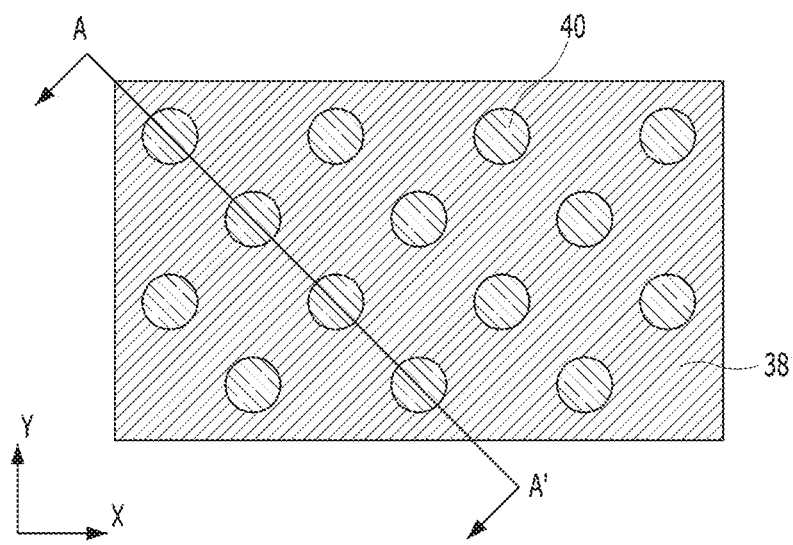

As illustrated in FIGS. 5F and 6F, a victim layer 40 may be formed to fill the hole openings 39. The victim layer 40 may serve as a victim layer for forming a damascene structure with line openings (not illustrated) to be formed through a subsequent process. The victim layer 40 may be formed of a material having an etch selectivity with respect to the second interlayer dielectric layer 35 and the first mold layer 38. The victim layer 40 may be formed of a material which can be easily removed through wet or dry cleaning. The victim layer 40 may be formed through a series of processes of applying an insulating material to such a sufficient thickness as to fill the hole openings 39, and performing an isolation process for leaving the insulating material in the hole openings 39.

Figure 5G:
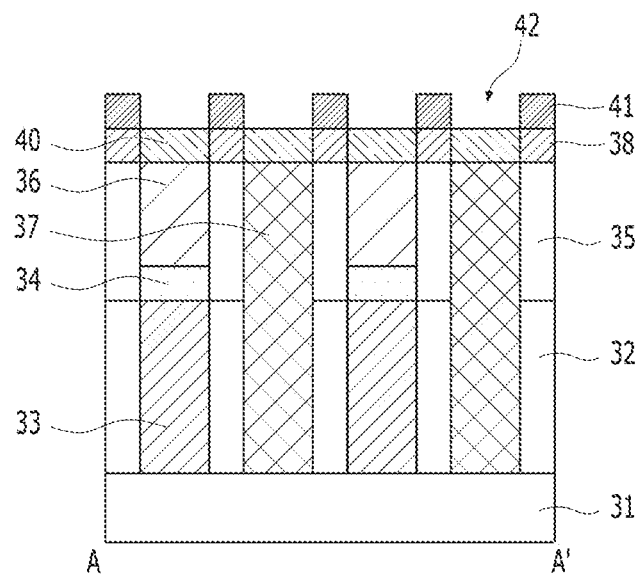
Figure 6G:
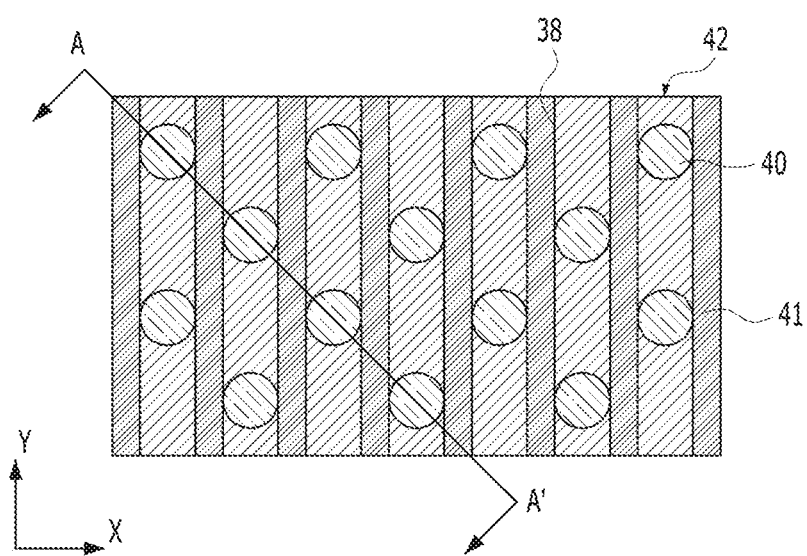

As illustrated in FIGS. 5G and 6G, a second mold layer 41 may be formed on the entire surface of the resultant structure including the first mold layer 38. The second mold layer 41 may serve as a mold layer for forming conductive lines (not illustrated) and an insulating layer for insulation between adjacent conductive lines. The second mold layer 41 may include an insulating material, for example, oxide, nitride, or oxynitride.

Then, the second mold layer 41 may be selectively etched to form a plurality of line openings 42 which expose the victim layer 40. The line openings 42 may indicate line-type openings extended in the second direction Y. The line openings 42 may be arranged at a predetermined distance from each other in the first direction X. That is, the line openings 42 may be divided into openings which overlap the top contacts 36 and openings which overlap the source line contacts 37.

Figure 5H:
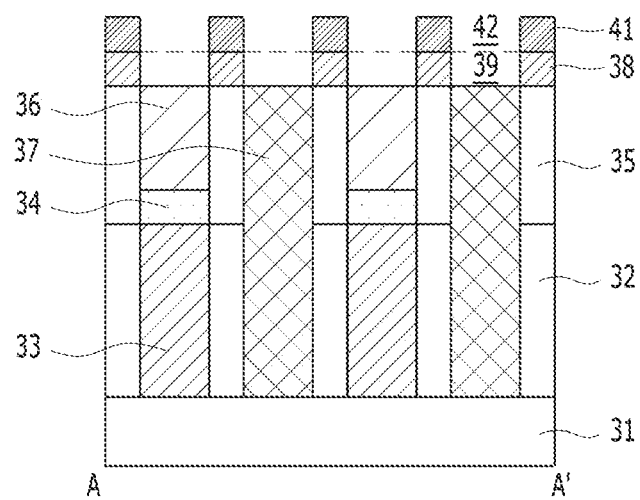
Figure 6H:
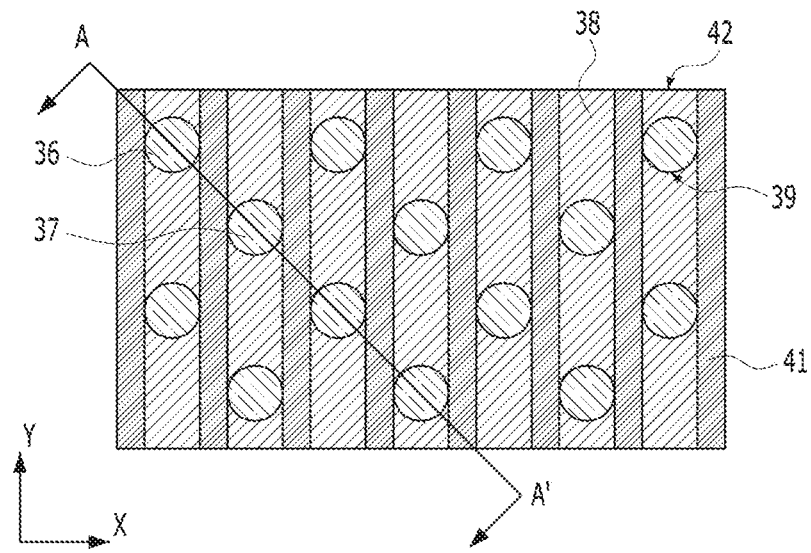

As illustrated in FIGS. 5H and 6H, the victim layer 40 (refer to FIG. 5G) may be removed. The victim layer can be removed through dry or wet cleaning.

As the victim layer is removed, the hole openings 39 may be exposed, and a damascene structure may be formed by the hole openings 39 and the line openings 42.

Figure 5I:
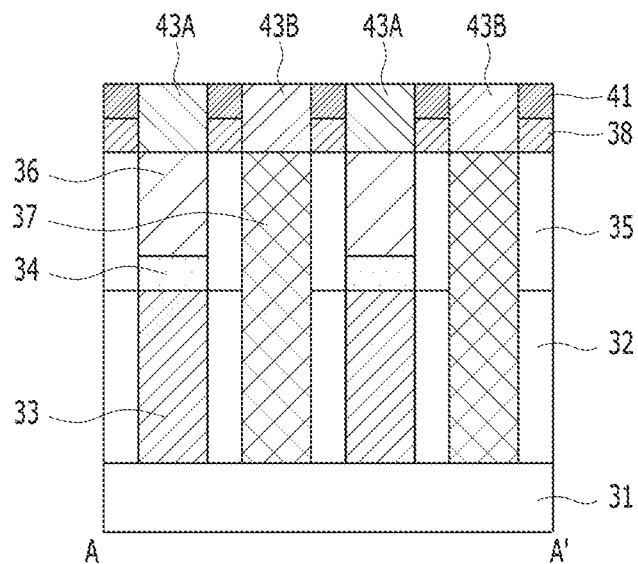
Figure 6I:
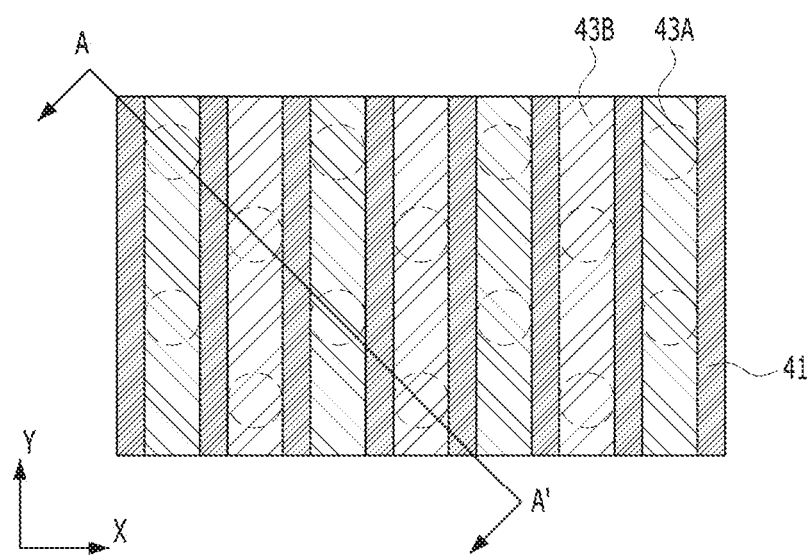

As illustrated in FIGS. 5I and 6I, a plurality of bit lines 43A and source lines 43B may be formed to fill the hole openings 39 and the line openings 42 at the same time. The bit lines 43A and the source lines 43B may be formed through a series of processes of burying a conductive material in the damascene structure formed by the hole openings 39 and the line openings 42, and performing an isolation process for isolating adjacent bit lines 43A and/or source lines 43B using the second mold layer 41.

The bit lines 43A may be connected to the top contacts 36 so as to be electrically coupled to parts of the semiconductor substrate 31, that is, the drain regions of the transistors (not illustrated), and the source lines 43B may be connected to the source line contacts 37 so as to be electrically couple to the source regions of the transistors.

In the present implementation, the first mold layer 38 may be interposed between the second interlayer dielectric layer 35 and the second mold layer 41, in order to secure a distance between the top contacts 36 and the source line contacts 37 and the bit line 43A and the source line 43B, which makes it possible to prevent a short between the top contacts 36 and the source line contacts 37 and the bit line 43A and the source line 43B. Furthermore, the line width and positions of the hole openings 39 defined by the first mold layer 38 can be controlled, if necessary, and the damascene structure formed by the hole openings 39 and the line openings 42 can maximize an overlay margin between the top contacts 36 and the source line contacts 37 and the bit line 43A and the source line 43B.

In accordance with the present implementations, the electronic device including a semiconductor memory and the method for fabricating the same can facilitate the process and improve the characteristic of the variable resistance element.

The above and other memory circuits or semiconductor devices based on the disclosed technology can be used in a range of devices or systems. FIGS. 7-11 provide some examples of devices or systems that can implement the memory circuits disclosed herein.

Figure 7:
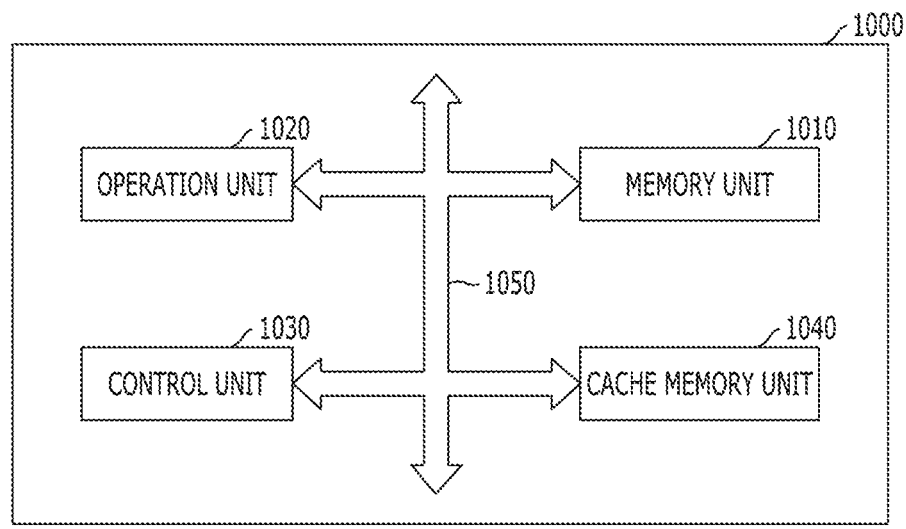
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings. Through this, data storage characteristics of the memory unit 1010 may be improved and fabricating processes may be easy. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
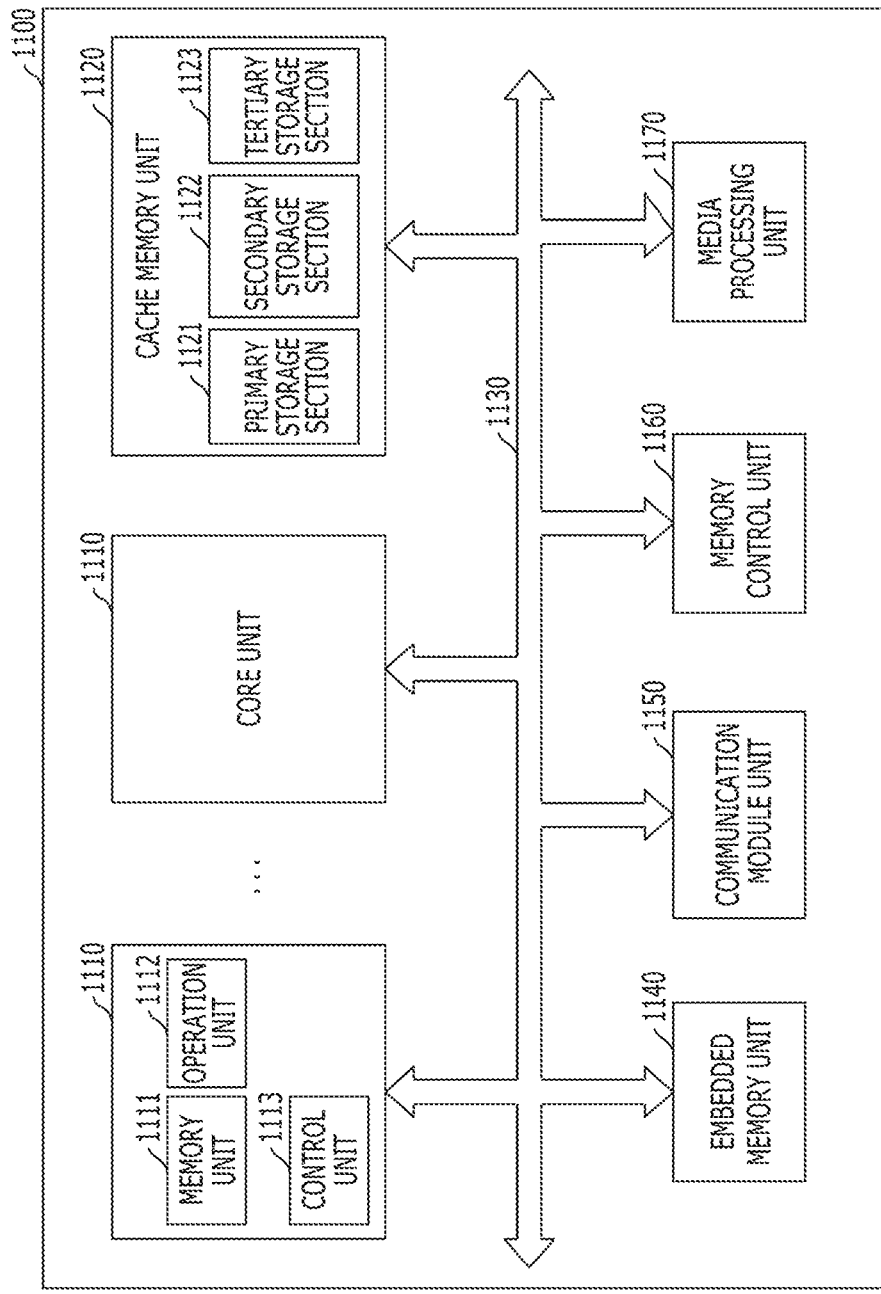
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings. Through this, data storage characteristics of the cache memory unit 1120 may be improved and fabricating processes may be easy. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
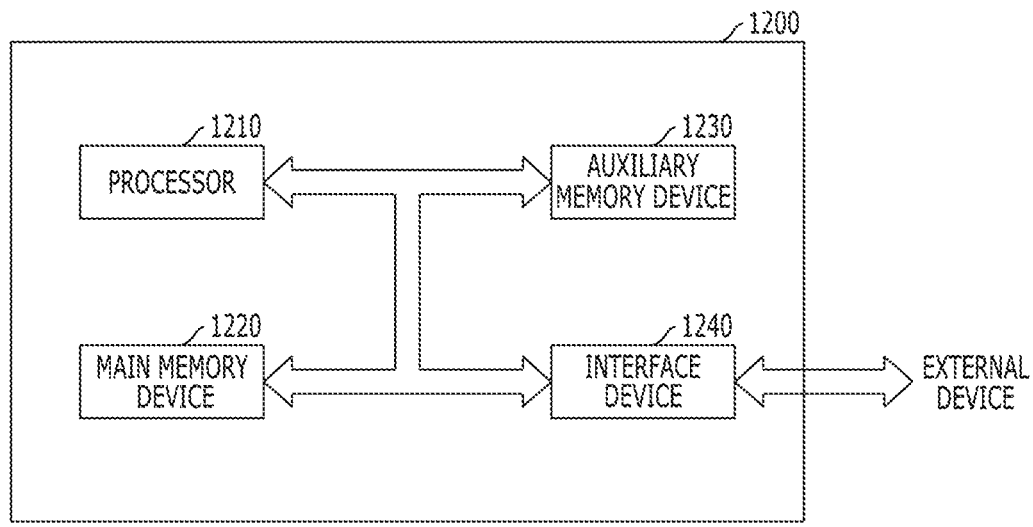
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings. Through this, data storage characteristics of the main memory device 1220 may be improved and fabricating processes may be easy. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings. Through this, data storage characteristics of the auxiliary memory device 1230 may be improved and fabricating processes may be easy. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
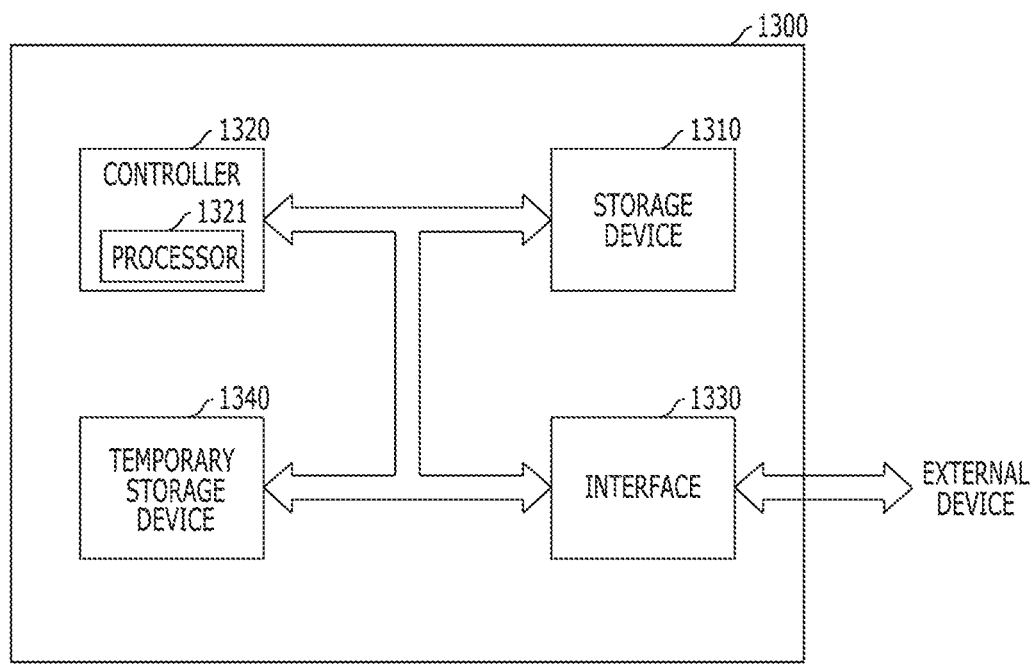
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings. Through this, data storage characteristics of the storage device 1310 or the temporary storage device 1340 may be improved and fabricating processes may be easy. As a consequence, operating characteristics and data storage characteristics of the data storage system 1300 may be improved.

Figure 11:
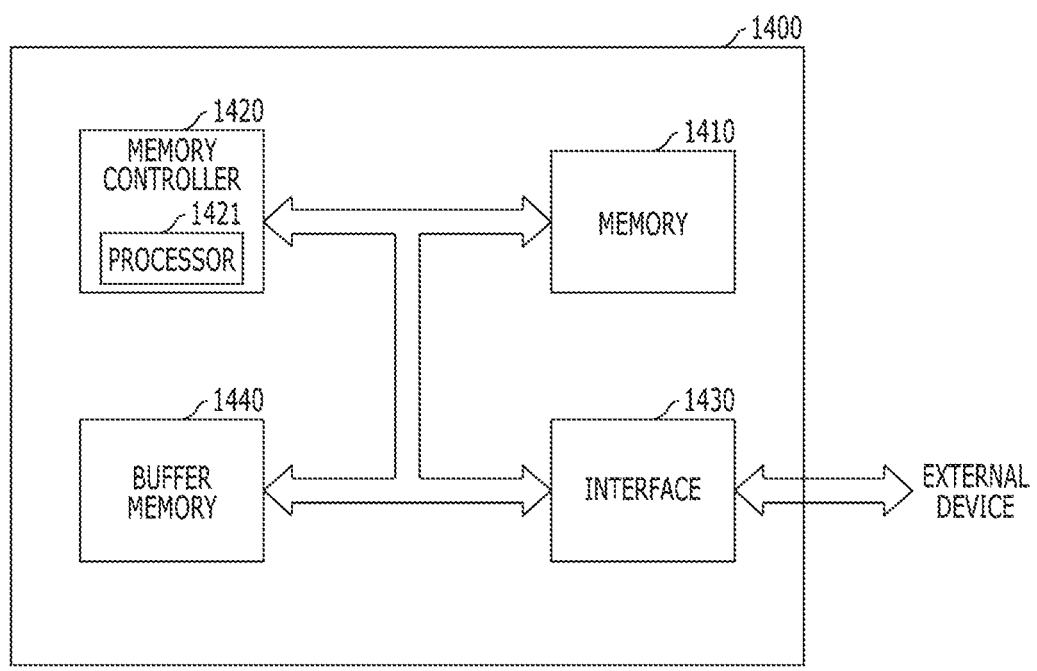
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings. Through this, data storage characteristics of the memory 1410 may be improved and fabricating processes may be easy. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a semiconductor substrate; a plurality of variable resistance elements formed over the semiconductor substrate; a plurality of top contacts formed over the variable resistance elements; a plurality of source line contacts arranged between the top contacts and connected to the semiconductor substrate; a first mold layer defining a plurality of hole openings, wherein the hole openings overlap the top contacts and the source line contacts; a second mold layer defining a plurality of line openings, wherein each of the line openings overlaps two or more hole openings of the hole openings; and a conductive material layer buried in the hole openings and the line openings. Through this, data storage characteristics of the buffer memory 1440 may be improved and fabricating processes may be easy. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
    wherein the semiconductor memory comprises:
    a substrate;
    a plurality of variable resistance elements formed over the substrate;
    a plurality of top contacts formed over the variable resistance elements;
    a plurality of source line contacts arranged between the top contacts and connected to the semiconductor substrate;
    a first mold layer defining a plurality of hole openings, wherein the hole openings overlap the top contacts and the source line contacts;
    a second mold layer defining a plurality of line openings, wherein each of the line openings overlaps two or more hole openings of the hole openings; and
    a conductive material layer buried in the hole openings and the line openings.

2. The electronic device of claim 1, further comprising a plurality of bottom contacts between the substrate and the variable resistance elements.

3. The electronic device of claim 1, wherein the variable resistance elements and the top contacts are arranged at a predetermined distance from each other in a first direction and a second direction crossing the first direction.

4. The electronic device of claim 1, wherein the source line contacts are arranged at a predetermined distance from each other in a first direction and a second direction crossing the first direction.

5. The electronic device of claim 1, wherein the top contacts and the source line contacts are alternately arranged so as not to overlap each other in a first direction and/or a second direction.

6. The electronic device of claim 1, wherein the top contacts and the source line contacts are alternately arranged at a predetermined distance from each other in a diagonal direction of a mesh formed by the plurality of variable resistance elements.

7. The electronic device of claim 1, wherein the hole openings are arranged in a mesh.

8. The electronic device of claim 1, wherein the line openings comprise line-type openings extended in a second direction.

9. The electronic device of claim 1, wherein the line openings are arranged at a predetermined distance from each other in a first direction.

10. The electronic device of claim 1, wherein the line openings comprise openings which overlap the top contacts and openings which overlap the source line contacts.

11. The electronic device of claim 1, wherein the first and second mold layers comprise an insulating material.

12. The electronic device of claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

13. The electronic device of claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

14. The electronic device of claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

15. The electronic device of claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

16. The electronic device of claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *